United States Patent [19]
Hunt

[11] Patent Number: 5,864,587
[45] Date of Patent: *Jan. 26, 1999

[54] DIFFERENTIAL SIGNAL RECEIVER

[75] Inventor: Kenneth Stephen Hunt, Camberley, United Kingdom

[73] Assignee: LSI Logic Corporation, Milpitas, Calif.

[ * ] Notice: The term of this patent shall not extend beyond the expiration date of Pat. No. 5,701,331.

[21] Appl. No.: 891,593

[22] Filed: Jul. 11, 1997

Related U.S. Application Data

[63] Continuation of Ser. No. 467,849, Jun. 6, 1995, Pat. No. 5,701,331.
[51] Int. Cl.⁶ .............................. H03K 9/00; H04L 27/06; H04L 27/14; H04L 27/22
[52] U.S. Cl. ...................... 375/316; 375/286; 375/257; 327/52; 330/259
[58] Field of Search ................................. 375/316, 286, 375/257, 354, 319; 327/65, 100, 108, 318, 333, 361, 563, 58–60, 62, 50, 51, 52; 341/56; 330/9, 252, 259

[56] References Cited

U.S. PATENT DOCUMENTS 5,666,354 9/1997 Cecchi et al. ........................... 370/284
5,701,331 12/1997 Hunt ....................................... 375/316

*Primary Examiner*—Chi H. Pham
*Assistant Examiner*—Bryan Webster

[57] ABSTRACT

A differential signal receiver circuit includes a first differential stage receiving input differential signals, a second differential stage receiving shifted differential signals and summing stage summing outputs of the first and second differential stages. Preferably the summing stage is formed by a wired-OR connection between the first and second differential stage outputs. The circuit finds application in digital systems for receiving data transmitted between digital equipment.

9 Claims, 5 Drawing Sheets

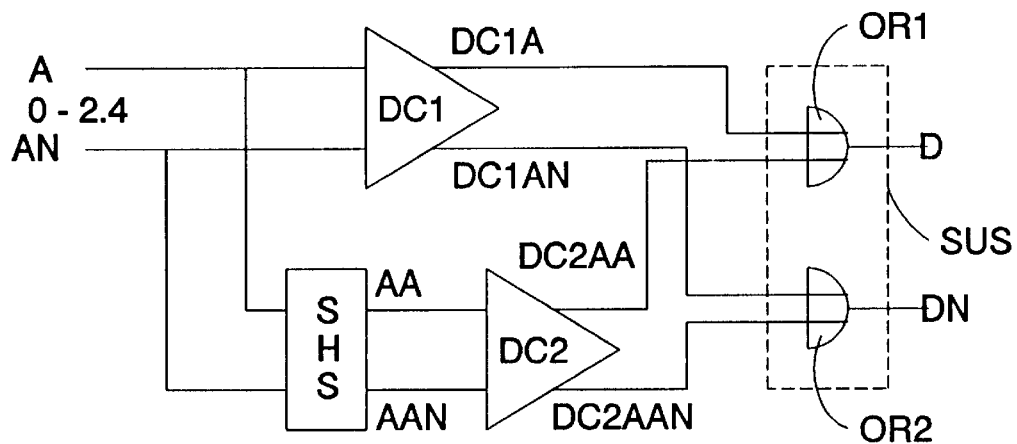
FIG. 6
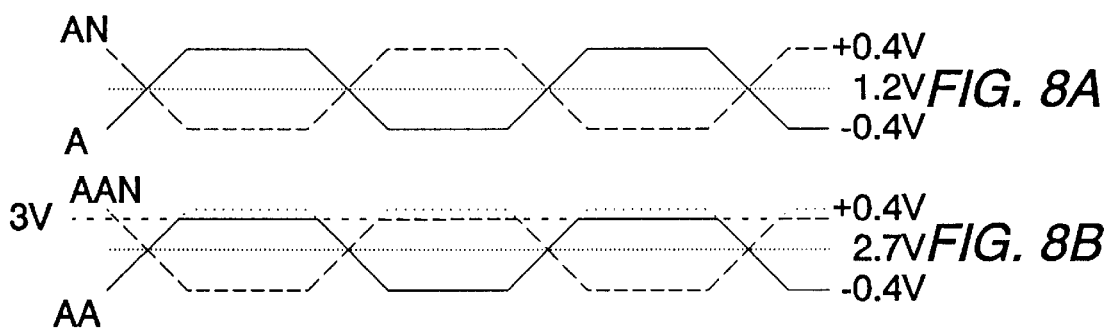
FIG. 8A
FIG. 8B
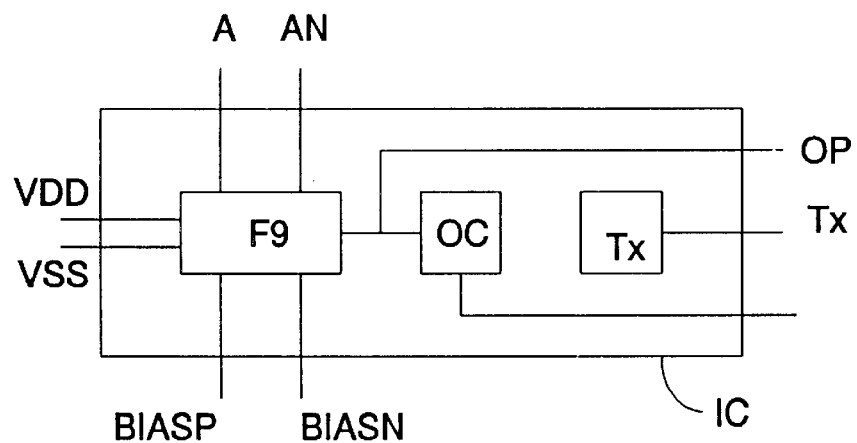
FIG. 10

5,864,587

DIFFERENTIAL SIGNAL RECEIVER

CROSS REFERENCE TO RELATED PATENT APPLICATION

This application is a continuation of application Ser. No. 08/467,849, filed Jun. 6, 1995; now U.S. Pat. No. 5,701,331; issued Dec. 23, 1997.

This patent application is related to and claims foreign priority under 35 U.S.C. § 119 of United Kingdom Patent Application No. 9501153.2, filed Jan. 20, 1995.

BACKGROUND OF THE INVENTION

1. Field of Invention

The invention relates to a circuit for receiving differential signals and to a digital system including such a circuit.

2. Discussion of the Related Art

It is known to transmit differential digital (normally binary) signals via line pairs, for example twisted line pairs between digital equipment, for example between computers or parts of a computer system. One standard for the transmission of digital signals, the IEEE Standard for Low-Voltage Differential Signals for SCI (LVDS)', draft 1.00 IEEE Std 1596.3-1994, December 1993, requires that differential transmission equipment transmits signals with differential voltages of +/− 250 mV to +/− 400 mV and a common mode voltage of 1.2 V, with a possible deviation of ±0.75 mV, and frequencies of up to 622 MHz. Reception equipment has to be capable of receiving these signals with an extended common mode range of between 0–2.4 V to take account of, for example, differences in the ground potential of different pieces of equipment.

FIG. 1 illustrates an example of an interconnection between a first computer 10 and a second computer 12 via a paired cable 14. The first computer 10 includes a transmitter Tx 16 for transmitting differential binary signals via the paired cable 14 to a receiver Rx 18 at the second computer 12. Likewise, the second computer 12 includes a transmitter Tx 20 for transmitting differential signals via the paired cable 22 to a receiver Rx 24 at the first computer 12.

FIG. 2A illustrates an example of a transmitted differential signal, with differential voltages of +/− 250 mV to +/− 400 mV and a common mode of 1.2 V with a deviation of ±75 mV.

It will be noted that FIG. 1 represents that the second computer 12 has a ground potential in a range of −1.2 to +1.2 volts compared to the ground potential of the first computer 10. FIG. 2B represents that the receiver must be capable of receiving the transmitted signal with a common mode voltage in the range of 0 V to 2.4 V, that is ±1.2 V with respect to the transmitting computer. The need to detect the digital signals when the common mode is over a range of 2.4 volts poses problems where the supply voltage of the receiver circuitry is 3 volts as the 2.4 volt range approaches the supply voltage.

Typically, a conventional differential voltage comparator circuit as illustrated, for example, in FIG. 3 can only derive a differential digital signal from an input differential digital signal with a common mode range of about half the supply voltage VDD. Thus, in FIG. 3 where VDD is 3 volts, it is possible to detect digital signals with a common mode range of only about 1.5 volts to supply or using the equivalent complementary circuit to detect digital signals with a common mode range of only up to about 1.5 volts. This is not sufficient to meet the LVDS standard. In FIG. 3, T1, T4 and T5 are current supply transistors and T2 and T3 are comparator transistors for the first and second differential signal lines.

One internal proposal for meeting the LVDS standard was to employ a voltage divider to reduce the input voltage range to a differential voltage comparator as shown in FIG. 3. A circuit of this type is illustrated in FIG. 4 where resistors R1 and R2 form a resistive bridge and DC1 represents the differential comparator of FIG. 3. However, not only the common mode range as input to the differential comparator DC1 is reduced, but also the differential signal level. This means that the circuit of FIG. 4 reduces the resolution of the receiver circuit. Moreover, the resistive bridge formed by the resistors R1 and R2 introduces an undesirable current drain.

An alternative internal proposal relates to the arrangement illustrated in FIG. 5 where, in addition to a first differential comparator DC1 as shown in FIG. 3, a second differential comparator DC2 is provided. The second differential comparator DC2 is constructed using the complementary circuit of DC1 so that it detects over a voltage range from 1.5–3 volts. To select between the output of the first and second differential comparators, a third comparator C3 is provided. The third comparator may, as shown, be a simple threshold detector connected to one line of the input line pair, or it could be a further differential comparator connected to both lines of the input line pair. The purpose of the third comparator C3 is to detect whether the common mode is greater than or less than 1.5 volts, and in dependence thereon, to output a signal to a multiplexer M for selecting either the outputs of the first differential comparator DC1 or the outputs of the first differential comparator DC2. This circuit has a significant disadvantage which results from delays in deciding whether to select the outputs from the first or the second differential comparators. This is particularly a problem where the common mode is hovering around the midpoint at 1.5 volts. This circuit is not able, therefore, reliably to meet the LVDS standard.

There is, therefore, a need for a reliable and efficient solution to the detection of differential digital signals with a variable common mode.

SUMMARY OF THE INVENTION

It is therefore an object of the present invention to reliably and efficiently detect differential digital signals with a variable common mode.

In accordance with a first aspect of the invention, there is provided a differential signal receiver circuit comprising a first differential stage receiving input differential signals, a second differential stage receiving shifted differential signals and summing stage summing outputs of said first and second differential stages.

The invention also provides a differential signal receiving circuit comprising differential signal inputs, a first differential stage connected to said differential signal inputs for providing first differential outputs, a shifting stage connected to said differential signal inputs for providing shifted differential signals, a second differential stage connected to said shifting stage to receive said shifted differential signals for providing second differential outputs and a summing stage for summing said first and second differential outputs to provide received differential signals.

Thus, in a circuit in accordance with the invention, the received differential signals are formed by summing the outputs of a first, normal differential stage and a second, shifted differential stage.

In accordance with a further aspect of the invention, there is provided a digital system comprising at least one line pair for the transmission of digital signals and a differential signal receiver circuit, said differential signal receiver circuit comprising:

differential signal inputs;

a first differential stage connected to said differential signal inputs for providing first differential outputs;

a shifting stage connected to said differential signal inputs for providing shifted differential signals;

a second differential stage connected to said shifting stage to receive said shifted signals for providing second differential outputs; and a summing stage for summing said first and second differential outputs to provide received differential signals.

In accordance with another aspect of the invention, there is provided a method of recovering received differential signals, said method comprising:

supplying received differential signals to a first differential stage;

forming shifted differential signals by applying a voltage offset to said received differential signals;

supplying said shifted differential signals to a second differential stage; and summing outputs of said first and second differential stages.

Other objects, features and advantages of the invention will become apparent in light of the following description thereof.

BRIEF DESCRIPTION OF THE DRAWINGS

FIG. 6 is a schematic block diagram of an example of the present invention;

FIGS. 8A and 8B illustrate differential signals in the circuit diagram of FIG. 7;

FIG. 10 is a schematic diagram of an integrated circuit employing the present invention for incorporation in the system of FIG. 1.

DETAILED DESCRIPTION OF THE INVENTION

FIG. 6 is a schematic block diagram of an example of the present invention. In FIG. 6 a differential signal receiving circuit comprises binary differential signal inputs A and AN. A first differential stage comprising a first differential comparator DC1 is connected to the differential signal inputs A and AN for providing first differential outputs DC1A and DC1AN. A shifting stage SHS is connected to the differential signal inputs A and AN for providing shifted differential signals AA and AAN. A second differential stage comprising a second differential comparator DC2 is connected to receive the shifted signals AA and AAN of the shifting stage SHS for providing second differential outputs DC2AA and DC2AAN. A summing stage SUS is connected for summing the differential outputs DC1A and DC2AA to form a first part D of the received differential signal and for summing the differential outputs DC1AN and DC2AAN to form the second, inverted part DN of the received binary differential signal.

Figure 7:
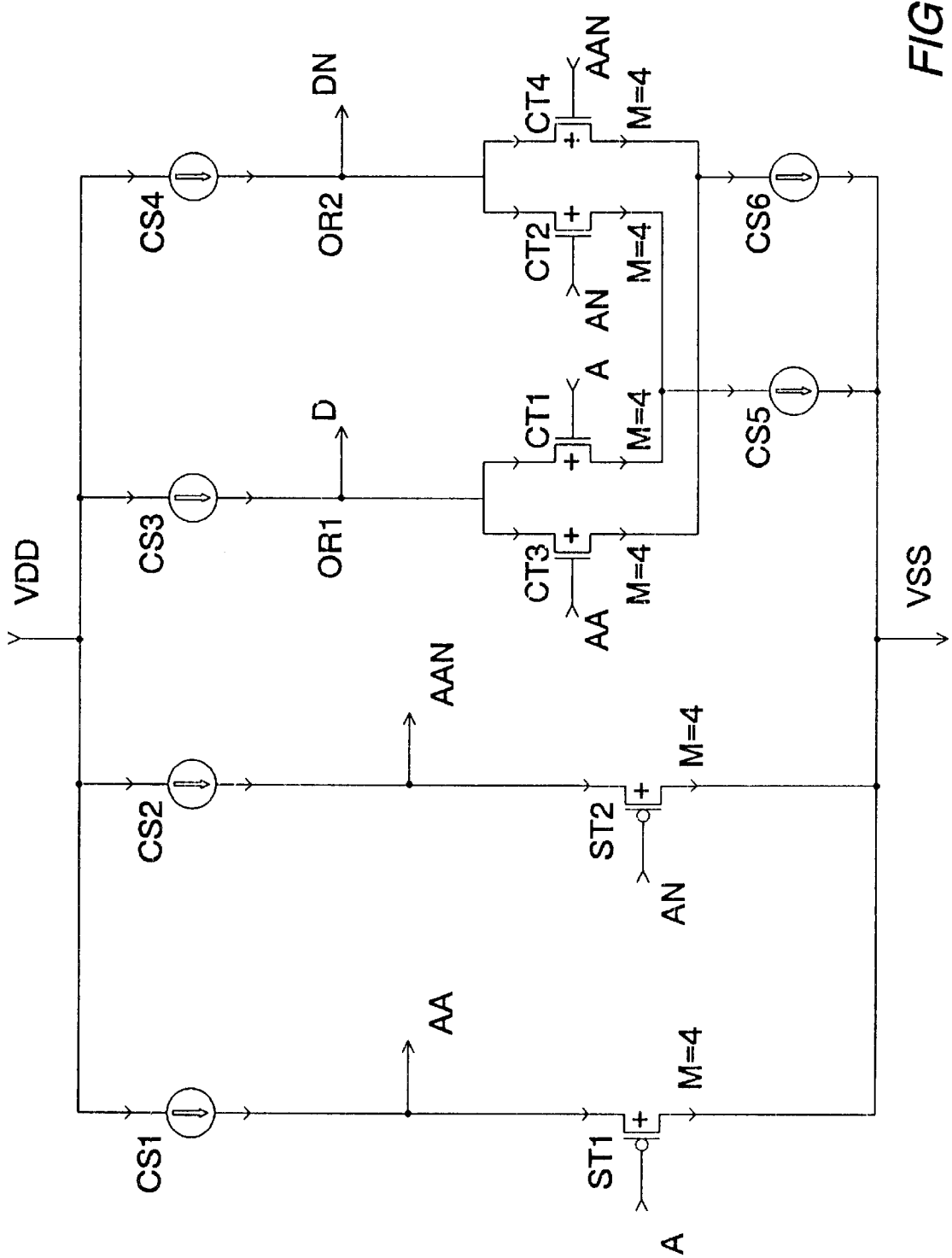
FIG. 7 is a simplified circuit diagram of a circuit in accordance with the invention.

FIG. 7 is a simplified circuit diagram of a circuit in accordance with the invention. In this circuit, the shifting stage comprises first and second shifting transistors ST1 and ST2, which in the present embodiment are P-channel Field Effect Transistors (P-FETs). The source and drain of the first shifting transistor ST1 are connected to a first voltage supply VDD (e.g., a voltage supply rail for connection to a 3 volt supply) via a first current source CS1, and to a second voltage supply VSS (e.g., a voltage supply rail for connection to a 0 volt supply). The gate of the first shifting transistor ST1 is connected to the first differential input A. The source and drain of the second shifting transistor ST2 are connected to the first voltage supply VDD via a second current source CS2, and to the second voltage supply VSS. The gate of the second shifting transistor ST2 is connected to the second differential input AN.

The first shifted differential signal AA is provided at the junction between the first shifting transistor ST1 and the first current source CS1 and the second shifted differential signal AAN is provided between said second shifting transistor ST2 and the second current source CS2.

The effect of the shifting stage is to apply a voltage offset to the input differential signals A and AN. The amount of the voltage offset, that is the amount by which the input differential signals A and AN are shifted to form the shifted signals AA and AAN vary normally with process variations but are normally in the range of 1.2 to 1.8 volts, more typically about 1.5 volts. The actual amount by which the input signals are shifted can generally be controlled in a manner which will be apparent to one skilled in the art by an appropriate configuring of the shifting transistors ST1 and ST2 and by configuring or controlling the current sources CS1 and CS2.

The first differential stage comprises a first comparator transistor CT1 connected via a third current source CS3 to the first voltage supply VDD and a second comparator transistor CT2 connected via a fourth current source CS4 to the first voltage supply VDD. In the present embodiment the first and second comparator transistors are N-channel Field Effect Transistors (N-FETs). The first and second comparator transistors, CT1 and CT2, are connected via a fifth current source CS5 to the second voltage supply VSS.

The gate of the first comparator transistor CT1 is connected to the first differential input A and the gate of the second comparator transistor is connected to the second differential input AN.

The second differential stage comprises a third comparator transistor CT3 connected via the third current source CS3 to the first voltage supply VDD and a fourth comparator transistor CT4 connected via the fourth current source CS4 to the first voltage supply VDD. The third and fourth comparator transistors, CT3 and CT4, are connected via a sixth current source CS6 to the second voltage supply VSS.

The gate of the third comparator transistor CT3 is connected to the first shifted differential signal AA and the gate of said fourth comparator transistor is connected to the second shifted differential signal AAN.

A summing stage is formed by the wired-OR connection OR1 of the junction between the first and third comparator transistors CT1 and CT3 and the third current source CS3, and the wired-OR connection OR2 of the junction between the second and fourth comparator transistors CT2 and CT4 and the fourth current source CS4.

A first received binary differential signal D is output from the junction OR1 between the first and third comparator transistors CT1 and CT3 and the third current source CS3. The second received differential signal DN is output from the junction OR2 between the second and fourth comparator transistors CT2 and CT4 and the fourth current source CS4.

The effect of the wired-OR connections OR1 and OR2 of the first and second differential stages is to sum the differential currents generated in the first and second differential circuits in response to the normal and shifted differential input signals, respectively.

The circuit arrangement illustrated in FIG. 7 provides a simple, fast, reliable and cost effective solution to meeting the LVDS standard referred to above. The circuit performance exceeds that required by the LVDS standard and has been seen to operate reliably at frequencies exceeding 800 MHz, and approaching 1 GHz.

FIGS. 8A and 8B illustrate the relationship between the signals A/AN and AA/AAN in the circuit arrangement of FIG. 7.

FIG. 8A represents the differential input signal A/AN. FIG. 8B represents the differential signal A/AN shifted by 1.5 volts to form the shifted differential signals AA/AAN including a representation of clipping which occurs at a supply voltage VDD of, in the present instance, 3 volts. The clipping of the shifted signals has a negligible effect on the successful reception of the input signal as it is a differential signal.

Figure 9:
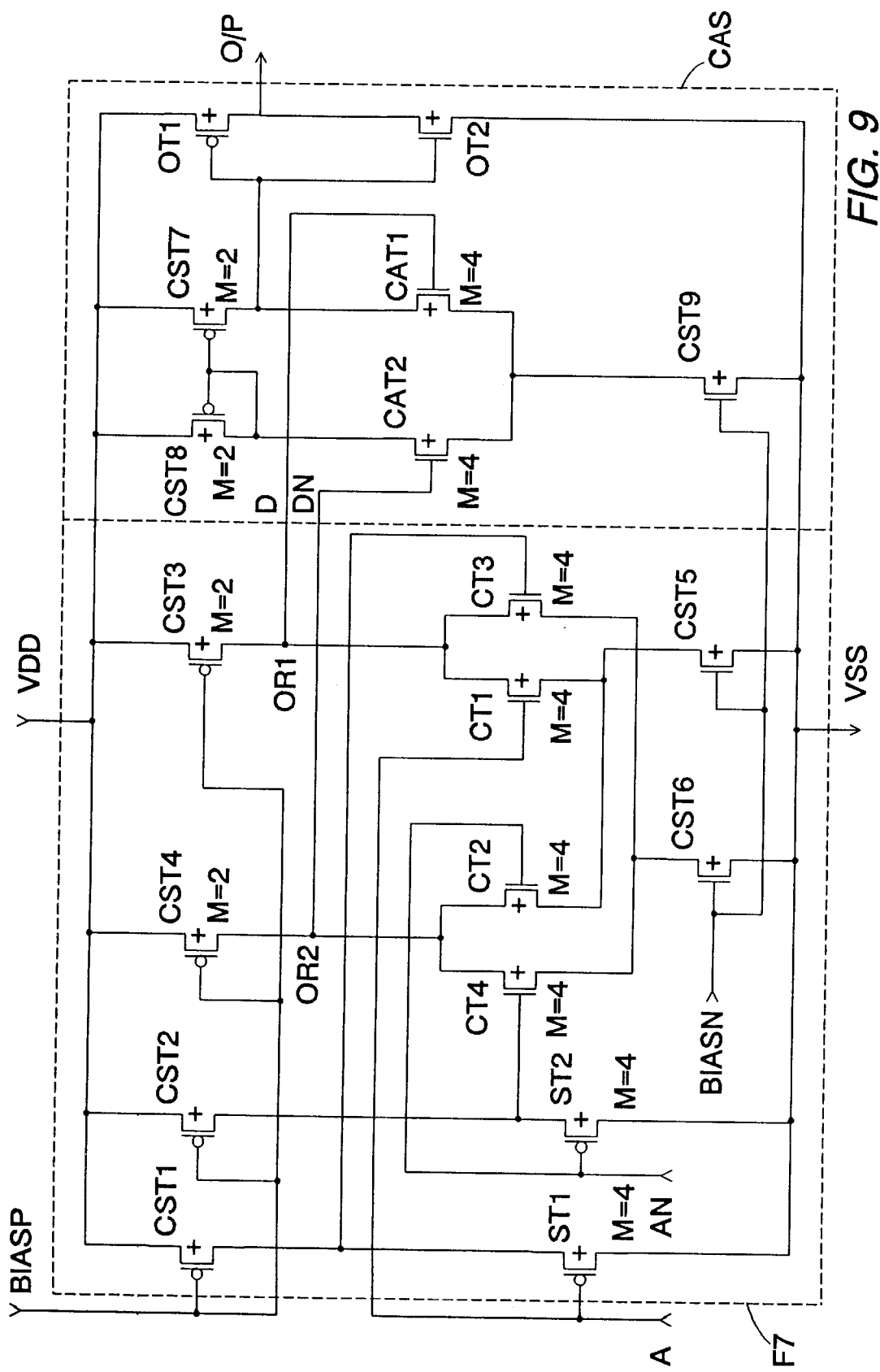
FIG. 9 is one embodiment of a circuit in accordance with the invention.

FIG. 9 is a schematic circuit diagram of a preferred embodiment of a receiver circuit in accordance with the invention. This circuit includes the shifting, first and second differential and summing stages of the circuit of FIG. 7 plus an additional comparison and amplification stage CAS for generating a single ended binary signal SEDS.

In the circuit in FIG. 9, the shifting, first and second differential and summing stages correspond generally to the equivalent stages of the circuit of FIG. 7 as represented by like reference signs. The portion of the circuit of FIG. 9 which corresponds to the circuit of FIG. 7 is located within the dashed outline F7.

It will be noted that the first to fourth current sources CS1–CS4 of FIG. 7 are formed by P-channel Field Effect Transistors (P-FETs) CST1–CST4, respectively, in FIG. 9, the gates of the transistors CST1–CST4 being connected to a common bias voltage BIASP. Also, the fifth and sixth current sources CS5, CS6 of FIG. 7 are formed by N-channel Field Effect Transistors (N-FETs) CST5, CST6, respectively, in FIG. 9, the gates of the transistors CST5, CST6 being connected to a common bias voltage BIASN.

The first received differential signal D is supplied to the gate of a first comparison and amplification transistor CAT1 of a comparison and amplification stage CAS. The second received differential signal DN is supplied to the gate of a second comparison and amplification transistor CAT2 of the comparison and amplification stage CAS. In this embodiment the comparison and amplification transistors CAT1 and CAT2 are N-channel Field Effect Transistors (N-FETs).

The first comparison and amplification transistor CAT1 is connected via a seventh current source transistor CST7 to the first voltage supply VDD and the second comparison and amplification transistor CAT2 is connected via an eighth current source transistor CST8 to the first voltage supply VDD. The first and second comparison and amplification transistors, CAT1 and CAT2, are connected via a ninth current source transistor CAT9 to the second voltage supply VSS. The gates of the seventh and eighth current source transistors CST7 and CST8 are connected in common to the junction between the output of the second current and amplification transistor CAT2 and the eighth current supply transistor CST8.

The junction between the first current and amplification transistor CAT1 and the seventh current supply transistor CST8 is connected to the gates of first and second output transistors OT1 and OT2. The first output transistor OT1, which in the present embodiment is an P-channel Field Effect Transistor (P-FET), is connected between the first voltage supply VDD and an output O/P. The second output transistor OT2, which in the present embodiment is an N-channel Field Effect Transistor (N-FET), is connected between the output O/P and the second voltage supply VSS.

The signal output from the junction between the first current and amplification transistor CAT1 and the seventh current supply transistor CST8 is thus used to switch either the first voltage supply or the second voltage supply to the signal output O/P for forming a binary output signal.

The absolute sizes of the transistors in the circuit is not significant to an implementation of the present invention. The circuit may be implemented with any appropriate discrete, or preferably integrated technology. The M=X references in FIG. 9 indicate preferred relationships between the sizes of the transistors and/or numbers of transistors if the circuit is implemented with discrete circuit elements (i.e., M=5 indicates a transistor five times the size of an M=1 transistor or that the transistor is formed by connecting five transistors in parallel).

FIG. 10 is a schematic illustration of an integrated circuit IC comprising a circuit as described with reference to FIG. 9. The integrated circuit includes inputs for the differential signals A and AN, the first and second voltage supplies VDD and VSS and the first and second bias voltages BIASP and BIASN. The integrated circuit can include an external output terminal for the output O/P of FIG. 9. However, the output O/P of FIG. 9 could alternatively be an internal connection between the output O/P of the circuit of FIG. 9 and other circuitry OC within the integrated circuit IC. Also, one or more of the input terminals illustrated in FIG. 9 could be generated internally to the integrated circuit IC of FIG. 10, rather than being externally supplied as illustrated in FIG. 10.

Figure 1:
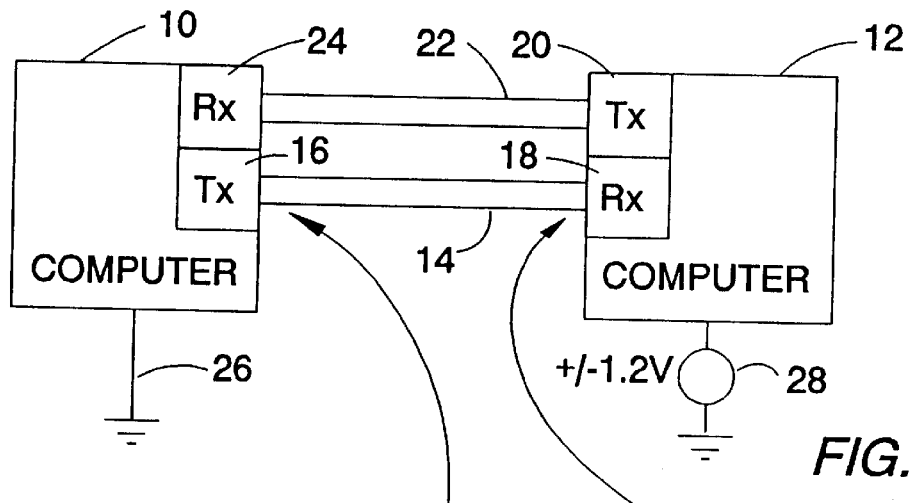
FIG. 1 is a example of an application of the present invention for the communication of data in a data processing system.
Figure 2A:
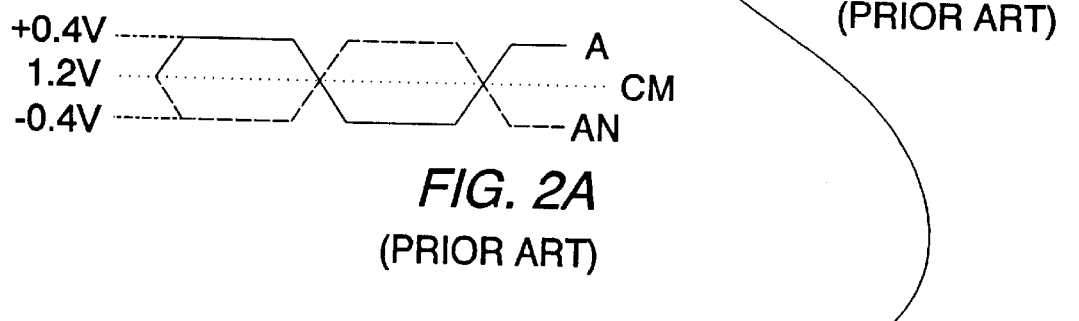
FIGS. 2A and 2B are schematic representations of differential signals transmitted along a data transmission line in the system of FIG. 1.
Figure 2B:
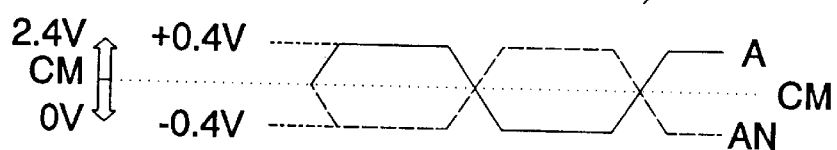
Figure 3:
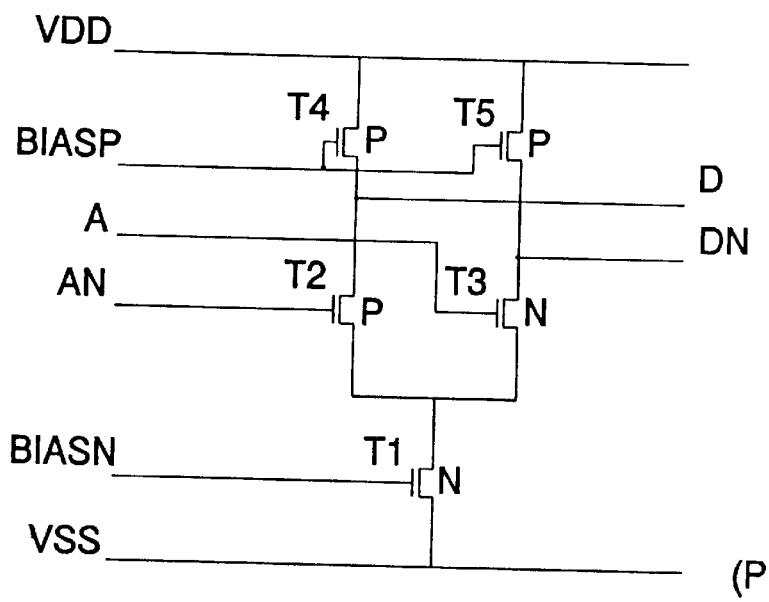
FIG. 3 is a schematic circuit diagram of a prior art differential comparator.
Figure 4:
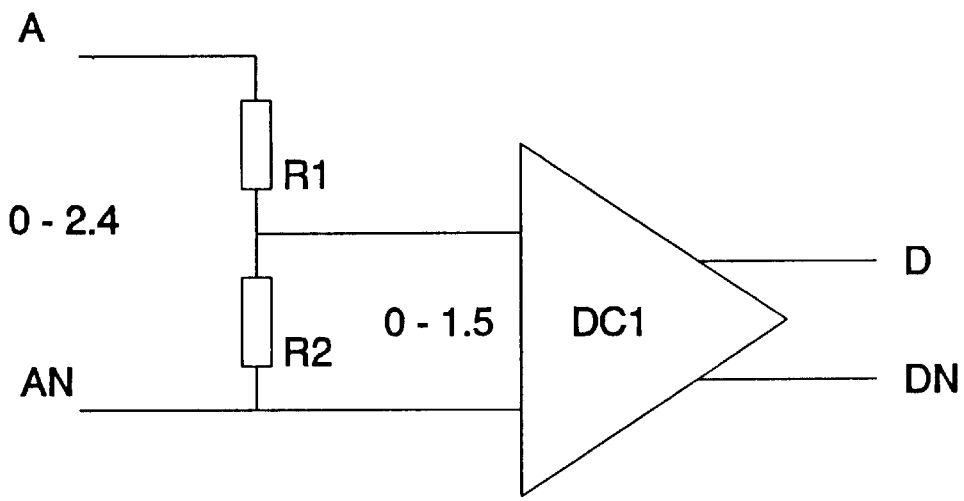
FIG. 4 is a schematic diagram of one proposal for a solution to the problems to which the present invention forms the solution.
Figure 5:
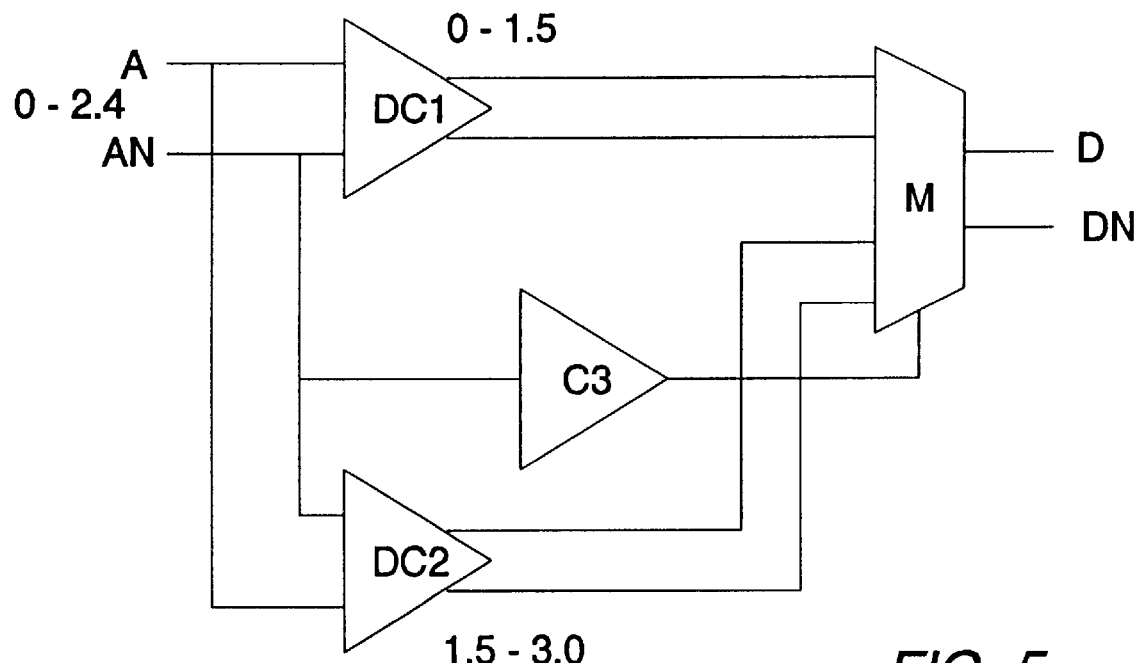
FIG. 5 is a schematic diagram of a second proposal for a solution to said problems.

Thus, as well as the circuits described with reference to FIG. 9 represented within the dashed outline F9, the integrated circuit of FIG. 10 can include other signal processing circuitry OC as required, for example circuitry for processing the signal at the output O/P of FIG. 9. The integrated circuit of FIG. 9 could additionally include a transmitter circuit Tx for transmitting data signals via a signal pair of the system of FIG. 1.

Although the invention has been described with reference to particular embodiments, it will be appreciated by one skilled in the art that the invention is not limited thereto and that many modifications and/or additions may be made within the scope of the invention.

For example, although in the present embodiment the invention is implemented using FET technology, other embodiment could be gated on other circuit technology. Also, the circuit configurations could be changed in accordance with design preferences.

Although the invention has been described in particular in the context of the LVDS standard and for circuits with a supply voltage VDD of 3 volts, it will be appreciated that the invention could be used in other applications and with other supply voltages. The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A differential signal receiver, comprising:
    a first differential stage receiving differential signal inputs for providing first differential outputs corresponding to the received differential signal inputs;
    a voltage shifting stage receiving the differential signal inputs for providing voltage shifted differential signals;
    a second differential stage receiving the voltage shifted differential signals from said voltage shifting stage and providing second differential outputs corresponding to the voltage shifted differential signals; and
    a summing stage for summing the first and second differential outputs from the first and second differential stages to form a differential output signal.

2. The receiver according to claim 1, wherein said first differential stage comprises a first differential comparator and said second differential stage comprises a second differential comparator.

3. The receiver according to claim 1, further comprising a comparison and amplification stage connected to receive the differential output signal from said summing stage to provide a single ended received binary signal.

4. The receiver according to claim 1, wherein said receiver is fabricated on an integrated circuit.

5. The receiver according to claim 1, wherein said receiver is part of a digital system having at least one line pair for the transmission of digital signals.

6. A method of recovering received differential signals, said method comprising the steps of:
    supplying received differential signals to a first differential stage;
    forming voltage shifted differential signals by applying a voltage offset to said received differential signals;
    supplying said voltage shifted differential signals to a second differential stage; and
    summing outputs of said first and second differential stages.

7. A method of recovering received differential signals, said method comprising the steps of:
    receiving differential signals with a first differential stage and providing first differential outputs corresponding to the received differential signals;
    shifting the voltage values of the received differential signals with a voltage shifting stage to provide voltage shifted differential signals;
    receiving the voltage shifted differential signals with a second differential stage and providing second differential outputs corresponding to the received voltage shifted differential signals; and
    summing the first and second differential outputs from said first and second differential stages with a summing stage to form a differential output signal.

8. A differential signal receiver circuit on an integrated circuit, comprising:
    a first differential stage receiving differential signals and providing first differential outputs corresponding to the received differential signals, wherein the received differential signals are a first differential input and a second differential input;
    a voltage shifting stage receiving the differential signals and providing voltage shifted differential signals, said voltage shifting stage comprising a first shifting transistor having a gate and a second shifting transistor having a gate, said gate of said first shifting transistor connecting to the first differential input and said gate of said second shifting transistor connecting to the second differential input;
    a second differential stage receiving the voltage shifted differential signals from said voltage shifting stage and providing second differential outputs corresponding to the received voltage shifted differential signals; and
    a summing stage for summing the first and second differential outputs from said first and second differential stages to form a differential output signal.

9. The receiver according to claim 8, wherein said receiver is part of a digital system having at least one line pair for the transmission of digital signals.

* * * * *